(12) United States Patent
Bertin

(10) Patent No.: US 7,768,304 B2
(45) Date of Patent: Aug. 3, 2010

(54) TRI-STATE CIRCUIT USING NANOTUBE SWITCHING ELEMENTS

(75) Inventor: Claude L. Bertin, Burlington, VT (US)

(73) Assignee: Nantero, Inc., Andover, MA (US)

( * ) Notice: Subject to any disclaimer, the term of this patent is extended or adjusted under 35 U.S.C. 154(b) by 176 days.

(21) Appl. No.: 11/928,538

(22) Filed: Oct. 30, 2007

(65) Prior Publication Data

US 2008/0231320 A1 Sep. 25, 2008

Related U.S. Application Data

(63) Continuation of application No. 11/656,253, filed on Jan. 22, 2007, now Pat. No. 7,288,961, which is a continuation of application No. 11/032,823, filed on Jan. 10, 2005, now Pat. No. 7,167,026.

(60) Provisional application No. 60/581,071, filed on Jun. 18, 2004.

(51) Int. Cl.
  *H03K 19/00* (2006.01)
  *H03K 19/02* (2006.01)
(52) U.S. Cl. .............................. 326/56; 326/6; 326/58; 326/113; 977/936; 977/940
(58) Field of Classification Search ............. 326/56–58, 326/112–113, 1–2, 6–7; 977/932, 936, 940
See application file for complete search history.

(56) References Cited

U.S. PATENT DOCUMENTS

| 4,979,149 | A | 12/1990 | Popovic et al. |
| 6,128,214 | A | 10/2000 | Kuekes et al. |
| 6,248,674 | B1 * | 6/2001 | Kamins et al. .............. 438/798 |
| 6,256,767 | B1 | 7/2001 | Kuekes et al. |
| 6,314,019 | B1 | 11/2001 | Kuekes et al. |

(Continued)

FOREIGN PATENT DOCUMENTS

GB 2364933 2/2002

(Continued)

OTHER PUBLICATIONS

Huang, Yu et al., "Logic Gates and Computation from Assembled Nanowire Building Blocks," Science, vol. 294, Nov. 9, 2001, pp. 1313-1317.

(Continued)

*Primary Examiner*—James H. Cho
*Assistant Examiner*—Jason Crawford
(74) *Attorney, Agent, or Firm*—Wilmer Cutler Pickering Hale and Dorr LLP

(57) ABSTRACT

Nanotube-based logic circuitry is disclosed. Tri-stating elements add an enable/disable function to the circuitry. The tri-stating elements may be provided by nanotube-based switching devices. In the disabled state, the outputs present a high impedance, i.e., are tri-stated, which state allows interconnection to a common bus or other shared communication lines. In embodiments wherein the components are non-volatile, the inverter state and the control state are maintained in the absence of power. Such an inverter may be used in conjunction with and in the absence of diodes, resistors and transistors or as part of or as a replacement to CMOS, biC-MOS, bipolar and other transistor level technologies.

8 Claims, 5 Drawing Sheets

U.S. PATENT DOCUMENTS

| | | | |
|---|---|---|---|
| 6,445,006 | B1 | 9/2002 | Brandes et al. |
| 6,548,841 | B2 | 4/2003 | Frazier et al. |
| 6,559,468 | B1 * | 5/2003 | Kuekes et al. ............... 257/14 |
| 6,574,130 | B2 | 6/2003 | Segal et al. |
| 6,643,165 | B2 | 11/2003 | Segal et al. |
| 6,706,402 | B2 | 3/2004 | Rueckes et al. |
| 6,707,098 | B2 | 3/2004 | Hofmann et al. |
| 6,759,693 | B2 | 7/2004 | Vogeli et al. |
| 6,784,028 | B2 | 8/2004 | Rueckes et al. |
| 6,803,840 | B2 | 10/2004 | Hunt et al. |
| 6,809,465 | B2 | 10/2004 | Jin |
| 6,835,591 | B2 | 12/2004 | Rueckes et al. |
| 6,918,284 | B2 | 7/2005 | Snow |
| 6,919,592 | B2 | 7/2005 | Segal et al. |
| 6,919,740 | B2 | 7/2005 | Snider |
| 6,990,009 | B2 | 1/2006 | Bertin et al. |
| 7,015,500 | B2 | 3/2006 | Choi et al. |
| 7,115,901 | B2 | 10/2006 | Bertin |
| 7,115,960 | B2 | 10/2006 | Bertin |
| 7,161,403 | B2 | 1/2007 | Bertin |
| 2001/0023986 | A1 | 9/2001 | Mancevski |
| 2002/0130353 | A1 * | 9/2002 | Lieber et al. ............... 257/315 |
| 2002/0173083 | A1 | 11/2002 | Avouris et al. |
| 2002/0175390 | A1 | 11/2002 | Goldstein |
| 2003/0021141 | A1 * | 1/2003 | Segal et al. ............... 365/129 |
| 2003/0021966 | A1 | 1/2003 | Segal et al. |
| 2003/0124325 | A1 | 7/2003 | Rueckes et al. |
| 2003/0200521 | A1 | 10/2003 | DeHon et al. |
| 2004/0031975 | A1 * | 2/2004 | Kern et al. ............... 257/213 |
| 2004/0095159 | A1 * | 5/2004 | Kimura ............... 326/33 |
| 2004/0175856 | A1 * | 9/2004 | Jaiprakash et al. ............ 438/52 |
| 2004/0181630 | A1 | 9/2004 | Jaiprakash et al. |
| 2004/0214389 | A1 * | 10/2004 | Madurawe ............... 438/202 |
| 2005/0035344 | A1 | 2/2005 | Bertin et al. |
| 2005/0035367 | A1 | 2/2005 | Bertin et al. |
| 2005/0035786 | A1 | 2/2005 | Bertin et al. |
| 2005/0035787 | A1 | 2/2005 | Bertin et al. |
| 2005/0036365 | A1 | 2/2005 | Bertin et al. |
| 2005/0037547 | A1 | 2/2005 | Bertin et al. |
| 2005/0047244 | A1 * | 3/2005 | Ruckes et al. ............. 365/222 |
| 2005/0056877 | A1 | 3/2005 | Rueckes |
| 2005/0093573 | A1 * | 5/2005 | Madurawe ............... 326/41 |
| 2005/0280436 | A1 | 12/2005 | Bertin |
| 2006/0044035 | A1 | 3/2006 | Bertin |
| 2006/0237537 | A1 | 10/2006 | Empedocles |

FOREIGN PATENT DOCUMENTS

| | | |
|---|---|---|
| WO | WO-00/48195 | 8/2000 |
| WO | WO-01/03208 A1 | 1/2001 |
| WO | WO-03091486 A1 | 11/2003 |
| WO | WO-2004065655 A1 | 8/2004 |
| WO | WO-2004065657 A1 | 8/2004 |
| WO | WO-2004065671 A1 | 8/2004 |

OTHER PUBLICATIONS

Martel, R., et al, "Carbon Nanotube Field-Effect Transistors and Logic Circuits," *DAC 2002*, Jun. 10-12, 2002, vol. 7.4, pp. 94-98.

Lin, Y.M. et al., "Novel Carbon Nanotube FET Design with Tunable Polarity", *IEDM*, pp. 29.2.1-29.2.4, 2004.

Wind, S. J. et al., "Vertical scaling of carbon nanotube field-effect transistors using top gate electrodes", *Applied Physics Letters*, vol. 80, No. 20, pp. 3817-3819, May 20, 2002.

Radosavljevic, M. et al., "Nonvolatile molecular memory elements based on ambipolar nanotube field effect transistors," Nano Letters, 2002, vol. 2(7), 761-764.

Rueckes, T., et al., "Carbon Nanotube-Based Nonvolatile Random Access Memory for Molecular Computing", Science, vol. 289, Issue 5476, Jul. 7, 2000, pp. 94-97.

Bachtold, A. et al., "Logic Circuits with Carbon Nanotube Transistors", Science, 2001. 294, 1317-1320. cited by other.

Derycke, V. et al. "Carbon Nanotube Inter-and Intramolecular Logic Gates." Nano Letters, vol. 1, pp. 453-456, Sep. 2001.

Derycke, V., "Controlling Doping and Carrier Injection in Carbon NanotubeTransistors", Applied Physics Letters, 2002. 80 (15) 2773-2775. cited by other.

Duan, Xiangfeng, Nonvolatile Memory and Programmable Logic from Molecule-Gated Nanowires, Nano Letters, Mar. 2002, pp. 1-4.

Heinze, S., "Carbon Nanotubes as Schottky Barrier Transistors," Physical Review Letters, vol. 89, No. 10, pp. 106801-1-106801-4, Sep. 2, 2002.

Javey, Ali et al., "Carbon Nanotube Transistor Arrays for Multistage Complementary Logic and Ring Oscillators", Nano Letters, 2002. 2 (9) 929-932. cited by other.

Wind, S. J., "Fabrication and Electrical Characterization of Top Gate Single-Wall Carbon Nanotube Field-Effect Transistors," IBM T. J. Watson Research Center, 14 pgs.

Chen, J. et al., "Self-aligned carbon nanotube transistors with charge transfer doping", *Applied Physics Letters*, vol. 86, pp. 123108-1-123108-3, 2005.

Chen, J. et al., "Self-aligned Carbon Nanotube Transistors with Novel Chemical Doping", *IEDM*, pp. 29.4.1-29.4.4, 2004.

Javey, A. et al., "Carbon Nanotube Field-Effect Transistors with Integrated Ohmic Contacts and High-k Gate Dielectrics", *Nano Letters*, vol. 4, No. 3, pp. 447-450, 2004.

Javey, A. et al., "High-k dielectrics for advanced carbon-nanotube transistors and logic gates", *Nature Materials*, vol. 1, pp. 241-246, Dec. 2002.

Ami, S. et al., "Logic gates and memory cells baed on single $C_{60}$ electrochemical transistors." Nanotechnology, 2000, vol. 12, pp. 44-52. cited by other.

Avouris, P., "Carbon nanotube electronics," Chemical Physics 2002, vol. 281, pp. 429-445.

Collier, C.P. et al., "Electronically Configurable Molecular-Based Logic Gates." Science, 1999, vol. 285, pp. 391-394. cited by other.

Dehon, A., "Array-Based Architecture for FET-Based, Nanoscale Electronics", IEEE Transactions on Nanotechnology, 2003, vol. 2(1), pp. 23-32. cited by other.

Dequesnes, M et al., "Simulation of carbon nanotube-based on a nanoelectromechanical switches." Computational Nanoscience and Nanotechnology, 2002, pp. 383-386. cited by other.

Dequesnes, M. et al., "Calculation of pull-in voltages for carbon-nanotube-based nanoelectromechanical switches." Nanotechnology, 2002, vol. 13, pp. 120-131. cited by other.

Franklin, N.R. et al., "Integration of suspended carbon nanotube arrays into electronic devices and electromechanical systems." Appl. Phys. Lett., vol. 81(5), pp. 913-915. cited by other.

Fuhrer, M.S., et al., "High-Mobility Nanotube Transistor Memory." Nano Letters, 2002, vol. 2(7), pp. 755-759. cited by other.

Hoenlein, W. et al., "Carbon nanotubes for microelectronics: status and future prospects." Materials Science and Engineering, 2003, vol. 23, pp. 663-669. cited by other.

Tans, S.J. et al., "Room-temperature transistor based on a single carbon nanotube." Nature, 1998, vol. 393, pp. 49-52. cited by other.

Zhan, W. et al., "Microelectrochemical Logic Circuits." J. Am. Chem. Soc., 2003, vol. 125, pp. 9934-9935. cited by other.

* cited by examiner

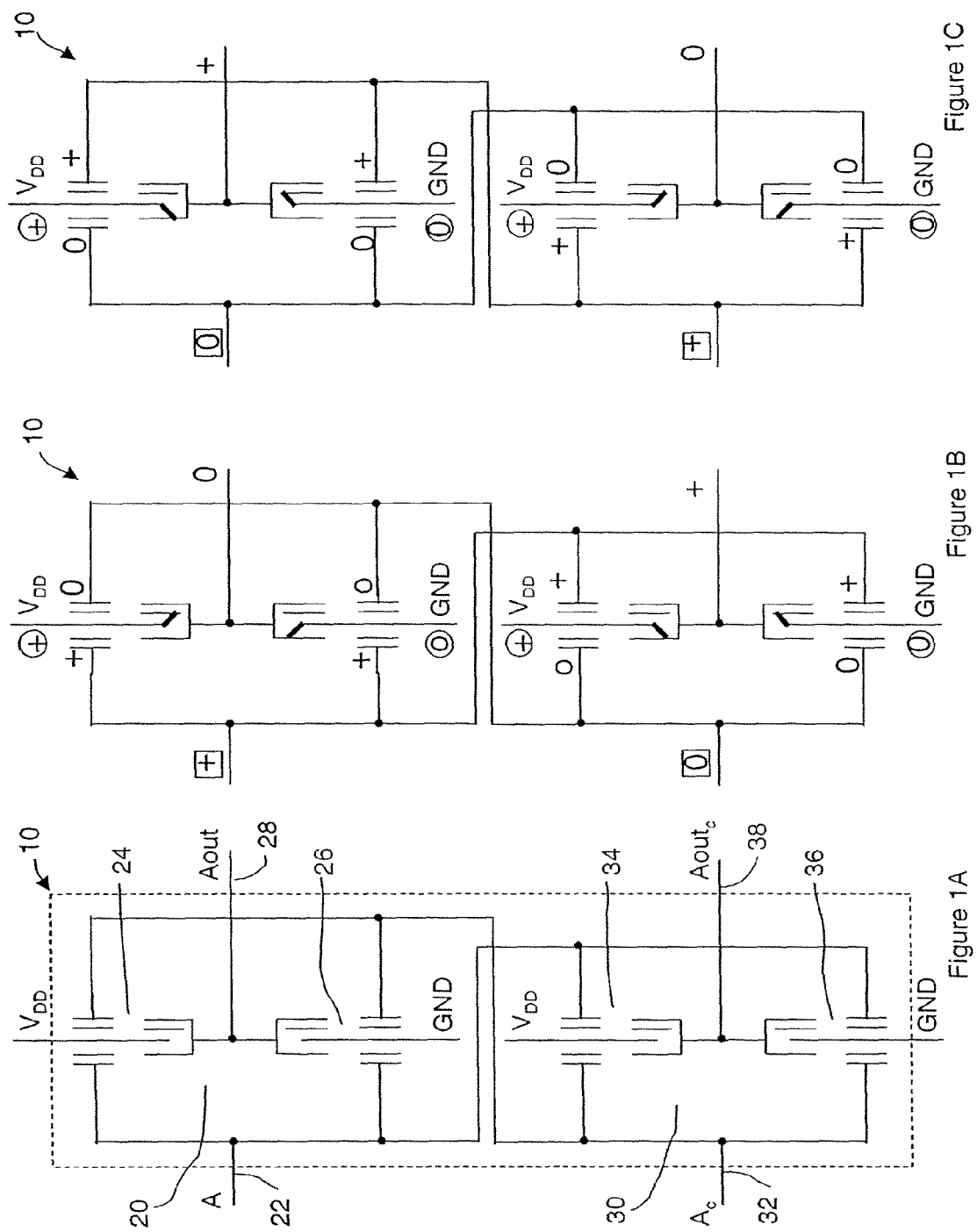

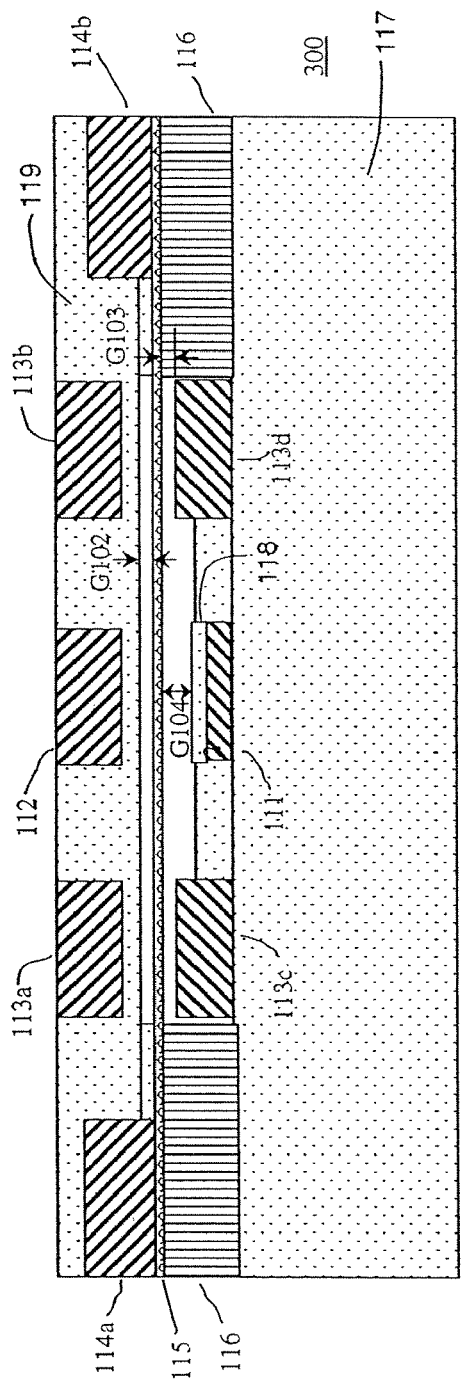
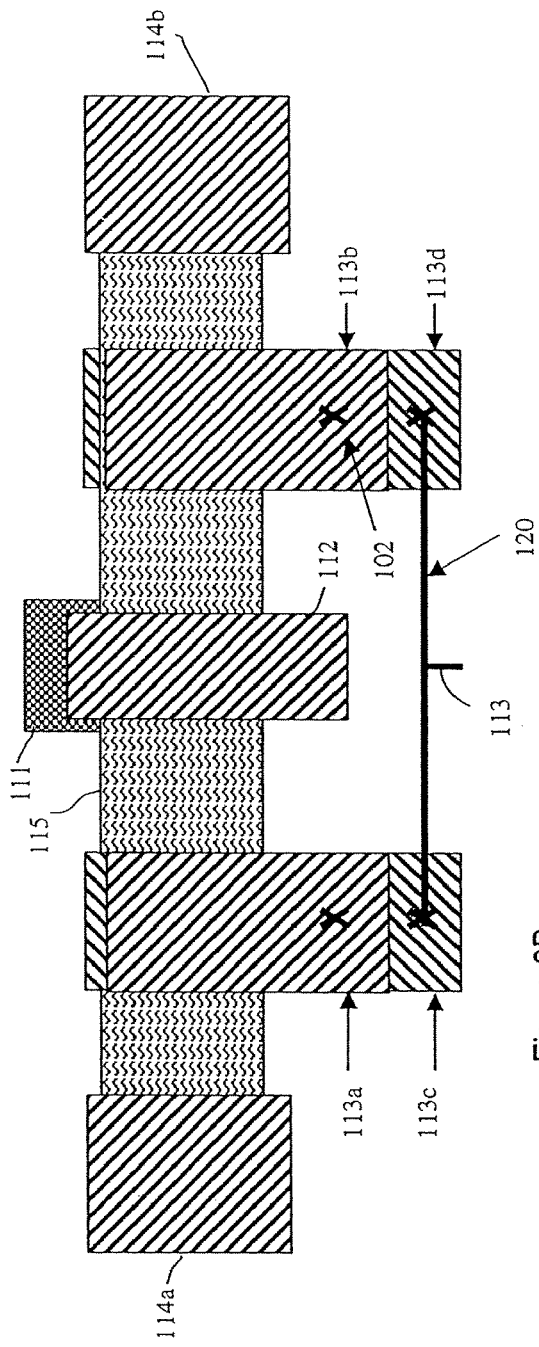
Figure 3A
Figure 3B

TRI-STATE CIRCUIT USING NANOTUBE SWITCHING ELEMENTS

CROSS-REFERENCE TO RELATED APPLICATIONS

This application is a continuation of and claims the benefit under 35 U.S.C. §120 of U.S. patent application Ser. No. 11/656,253, now U.S. Pat. No. 7,288,961, entitled *Tri-State Circuit Using Nanotube Switching Elements* and filed on Jan. 22, 2007, which is incorporated herein by reference in its entirety, which is a continuation of and claims the benefit under 35 U.S.C. §120 of U.S. patent application Ser. No. 11/032,823, now U.S. Pat. No. 7,167,026, entitled *Tri-State Circuit Using Nanotube Switching Elements* and filed on Jan. 10, 2005, which is incorporated herein by reference in its entirety, which claims the benefit under 35 U.S.C. §119(e) of U.S. Provisional Patent Application Ser. No. 60/581,071, *Nonvolatile Carbon Nanotube Logic (NLOGIC) Tri-state Circuit* filed on Jun. 18, 2004, which is incorporated herein by reference in its entirety.

This application is related to the following references:

U.S. patent application Ser. No. 10/917,794, now U.S. Pat. No. 7,115,960, filed on Aug. 13, 2004, entitled *Nanotube-Based Switching Elements*;

U.S. patent application Ser. No. 10/918,085, now U.S. Pat. No. 6,990,009, filed on Aug. 13, 2004, entitled *Nanotube-Based Switching Elements With Multiple Controls*;

U.S. patent application Ser. No. 10/918,181, now U.S. Pat. No. 7,071,023, filed on Aug. 13, 2004, entitled *Nanotube Device Structure And Methods Of Fabrication*;

U.S. patent application Ser. No. 10/917,893, now U.S. Pat. No. 7,138,832, filed on Aug. 13, 2004, entitled *Nanotube-Based Switching Elements And Logic Circuits*;

U.S. patent application Ser. No. 10/917,606, now U.S. Pat. No. 7,289,357, filed on Aug. 13, 2004, entitled *Isolation Structure For Deflectable Nanotube Elements*;

U.S. patent application Ser. No. 10/917,932, filed on Aug. 13, 2004, entitled *Circuits Made From Nanotube-Based Switching Elements With Multiple Controls*;

U.S. patent application Ser. No. 11/033,087, filed on Jan. 10, 2005, entitled *Nanotube-Based Transfer Devices and Related Circuits*;

U.S. patent application Ser. No. 11/033,089, now U.S. Pat. No. 7,288,970, filed on Jan. 10, 2005, entitled *Integrated Nanotube and Field Effect Switching Device*;

U.S. patent application Ser. No. 11/033,213, filed on Jan. 10, 2005, entitled *Receiver Circuit Using Nanotube-Based Switches and Transistors*;

U.S. patent application Ser. No. 11/033,215, filed on Jan. 10, 2005, entitled *Receiver Circuit Using Nanotube-based Switches and Logic*;

U.S. patent application Ser. No. 11/032,216, now U.S. Pat. No. 7,164,744, filed on Jan. 10, 2005, entitled *Nanotube-based Logic Driver Circuits*; and U.S. patent application Ser. No. 11/032,983, now U.S. Pat. No. 7,161,403, filed on Jan. 10, 2005, entitled *Storage Elements Using Nanotube Switching Elements*.

BACKGROUND

1. Technical Field

The present application relates in general to logic circuits and in particular to logic circuits constructed using nanotube switching elements.

2. Discussion of Related Art

Digital logic circuits are used in personal computers, portable electronic devices such as personal organizers and calculators, electronic entertainment devices, and in control circuits for appliances, telephone switching systems, automobiles, aircraft and other items of manufacture. Early digital logic was constructed out of discrete switching elements composed of individual bipolar transistors. With the invention of the bipolar integrated circuit, large numbers of individual switching elements could be combined on a single silicon substrate to create complete digital logic circuits such as inverters, NAND gates, NOR gates, flip-flops, adders, etc. However, the density of bipolar digital integrated circuits is limited by their high power consumption and the ability of packaging technology to dissipate the heat produced while the circuits are operating. The availability of metal oxide semiconductor ("MOS") integrated circuits using field effect transistor ("FET") switching elements significantly reduces the power consumption of digital logic and enables the construction of the high density, complex digital circuits used in current technology. The density and operating speed of MOS digital circuits are still limited by the need to dissipate the heat produced when the device is operating.

Digital logic integrated circuits constructed from bipolar or MOS devices do not function correctly under conditions of high heat or heavy radiation. Current digital integrated circuits are normally designed to operate at temperatures less than 100 degrees centigrade and few operate at temperatures over 200 degrees centigrade. In conventional integrated circuits, the leakage current of the individual switching elements in the "off" state increases rapidly with temperature. As leakage current increases, the operating temperature of the device rises, the power consumed by the circuit increases, and the difficulty of discriminating the off state from the on state reduces circuit reliability. Conventional digital logic circuits also short internally when subjected to heavy radiation because the radiation generates electrical currents inside the semiconductor material. It is possible to manufacture integrated circuits with special devices and isolation techniques so that they remain operational when exposed to heavy radiation, but the high cost of these devices limits their availability and practicality. In addition, radiation hardened digital circuits exhibit timing differences from their normal counterparts, requiring additional design verification to add radiation protection to an existing design.

Integrated circuits constructed from either bipolar or FET switching elements are volatile. They only maintain their internal logical state while power is applied to the device. When power is removed, the internal state is lost unless some type of non-volatile memory circuit, such as EEPROM (electrically erasable programmable read-only memory), is added internal or external to the device to maintain the logical state. Even if non-volatile memory is utilized to maintain the logical state, additional circuitry is necessary to transfer the digital logic state to the memory before power is lost, and to restore the state of the individual logic circuits when power is restored to the device. Alternative solutions to avoid losing information in volatile digital circuits, such as battery backup, also add cost and complexity to digital designs.

Important characteristics for logic circuits in an electronic device are low cost, high density, low power, and high speed. Resistance to radiation and the ability to function correctly at elevated temperatures also expand the applicability of digital logic. Conventional logic solutions are limited to silicon substrates, but logic circuits built on other substrates would allow logic devices to be integrated directly into many manufactured products in a single step, further reducing cost.

Recently, devices have been proposed which use nanoscopic wires, such as single-walled carbon nanotubes, to form crossbar junctions to serve as memory cells. (See WO 01/03208, Nanoscopic Wire-Based Devices, Arrays, and Methods of Their Manufacture; and Thomas Rueckes et al., "Carbon Nanotube-Based Nonvolatile Random Access Memory for Molecular Computing," Science, vol. 289, pp. 94-97, 7 Jul. 2000.) Hereinafter these devices are called nanotube wire crossbar memories (NTWCMs). Under these proposals, individual single-walled nanotube wires suspended over other wires define memory cells. Electrical signals are written to one or both wires to cause them to physically attract or repel relative to one another. Each physical state (i.e., attracted or repelled wires) corresponds to an electrical state. Repelled wires are an open circuit junction. Attracted wires are a closed state forming a rectified junction. When electrical power is removed from the junction, the wires retain their physical (and thus electrical) state thereby forming a nonvolatile memory cell.

U.S. Patent Publication No. 2003-0021966 discloses, among other things, electromechanical circuits, such as memory cells, in which circuits include a structure having electrically conductive traces and supports extending from a surface of a substrate. Nanotube ribbons that can electromechanically deform, or switch are suspended by the supports that cross the electrically conductive traces. Each ribbon comprises one or more nanotubes. The ribbons are typically formed from selectively removing material from a layer or matted fabric of nanotubes.

For example, a nanofabric may be patterned into ribbons, and the ribbons can be used as a component to create non-volatile electromechanical memory cells. The ribbon is electromechanically-deflectable in response to electrical stimulus of control traces and/or the ribbon. The deflected, physical state of the ribbon may be made to represent a corresponding information state. The deflected, physical state has non-volatile properties, meaning the ribbon retains its physical (and therefore informational) state even if power to the memory cell is removed. Three-trace architectures may be used for electromechanical memory cells, in which two of the traces are electrodes to control the deflection of the ribbon.

The use of an electromechanical bi-stable device for digital information storage has also been suggested.

The creation and operation of bi-stable, nano-electro-mechanical switches based on carbon nanotubes (including mono-layers constructed thereof) and metal electrodes has been detailed in previous patent applications of Nantero, Inc. (U.S. Pat. Nos. 6,574,130, 6,643,165, 6,706,402; U.S. patent application Ser. Nos. 09/915,093, 10/033,323, 10/033,032, 10/128,117, 10/341,005, 10/341,055, 10/341,054, 10/341,130, 10/776,059, 10/776,572, 10/917,794, and 10/918,085 the contents of which are hereby incorporated by reference in their entireties).

SUMMARY

The present invention provides logic circuits having a mode wherein the output can be set to a high-impedance condition. In various embodiments, the logic circuit and/or the tri-state feature may be implemented using nanotube switching elements and associated structures. In preferred embodiments, the logic circuits are implemented using complementary logic, particularly carbon nanotube-based complementary logic. In certain embodiments, the circuits thus combine the benefits of nanotube switching elements with the tri-state feature.

In certain embodiments, a pull-up tri-state element and a pull-down tri-state element are provided. The pull-up tri-state element is disposed between the upper power supply voltage and the pull-up logic circuitry. The pull-down tri-state element is disposed between the lower power supply voltage and the pull-down logic circuitry. Each tri-state element has a control structure for receiving a signal (or signals) that controls the activation of the element. The tri-state element is implemented using at least one nanotube-switching element.

In one aspect of the invention, a tri-state logic circuit includes an input terminal for receiving an input signal and an output terminal for providing an output signal. It also includes a pull-up network for connecting the output terminal to an upper power supply voltage, which is responsive to the input signal. The circuit further includes a first tri-stating nanotube switching element electrically connected in the signal path between the upper power supply voltage and the output terminal. The circuit also includes a pull-down network for connecting the output terminal to a lower power supply voltage, which is responsive to the input signal. A second tri-stating nanotube switching element is electrically connected in the signal path between the lower power supply voltage and the output terminal. The first and second nanotube switching elements are activated and deactivated to a tri-state control signal and the output terminal is tri-stated when the first and second nanotube switching elements are not activated.

In one aspect of the invention, the circuit implements a Boolean function.

In another aspect of the invention, the circuit implements an inverting function.

In another aspect of the invention, the pull-up network and the pull-down network are constructed of nanotube switching elements.

In another aspect of the invention, the first and second tri-stating nanotube switching elements are volatile.

In another aspect of the invention, the first and second tri-stating nanotube switching elements are non-volatile.

In another aspect of the invention, the first and second tri-stating nanotube switching elements are four-terminal devices.

In another aspect of the invention, a tri-state logic circuit, includes an input terminal for receiving an input signal and an output terminal for providing an output signal. A network of nanotube switching elements is connected between the input terminal and the output terminal such that it implements a Boolean transformation of the input signal to generate the output signal. A tri-stating nanotube switching element is connected to the network, activated by a tri-state control signal, and arranged so that the output terminal is tri-stated when the tri-stating nanotube switching element is not activated.

In one aspect of the invention, the nanotube switching elements in the network are volatile.

In another aspect of the invention, the nanotube switching elements in the network are non-volatile.

In another aspect of the invention, the tri-stating nanotube switching element is volatile.

In another aspect of the invention, the tri-stating nanotube switching element is non-volatile.

In another aspect of the invention, the tri-stating nanotube switching element is a four-terminal device.

In another aspect of the invention, an inverter circuit includes a dual-rail differential input, for receiving a first input signal and a first complementary input signal, and a dual-rail differential output, for providing a first output signal and a first complementary output signal. The circuit further includes a first inverter for inverting the first input signal to generate said first output signal, and a first tri-stating nanotube switching element pair connected to said first inverter. The circuit further includes a second inverter for inverting said first complementary input signal to generate said first complementary output signal, and a second tri-stating nanotube switching element pair connected to said second inverter. The circuit further includes a dual-rail differential control input, for receiving a first control input signal and a first complementary control input signal provided to cooperatively activate and deactivate the first tri-stating element pair and the second tri-stating element pair. The dual-rail differential output is in a floating state when the first tri-stating element pair and the second tri-stating element pair are deactivated.

In another aspect of the invention, the first inverter and the second inverter are constructed from nanotube switching elements.

In another aspect of the invention, the nanotube switching elements of the first inverter and the second inverter are volatile.

In another aspect of the invention, the nanotube switching elements of the first inverter and the second inverter are non-volatile.

In another aspect of the invention, the nanotube switching elements of the first and second tri-stating element pairs are volatile.

In another aspect of the invention, the nanotube switching elements of the first and second tri-stating element pairs are non-volatile.

The provision of a high-impedance state for the output allows the outputs of multiple inverters to be connected together to form busses, logic decoders, or other circuits. Certain embodiments may offer certain advantages. For example, there is no significant leakage current between input and output terminals in the "OFF" state of a complementary nanotube-based device, and there is no junction leakage. The nanotube devices may operate in harsh environments such as elevated temperatures, e.g., 150 to 200 deg-C. or higher. The nanotube devices do not exhibit alpha particle sensitivity.

The foregoing and other objects, features and advantages of the invention will be apparent from the following more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

BRIEF DESCRIPTION OF THE DRAWINGS

FIGS. 1A-C and 2A-C illustrate differential logic inverters according to certain embodiments of the invention;

FIGS. 3A-D are illustrations of an exemplary nanotube switching element used in certain embodiments of the invention.

DETAILED DESCRIPTION

The present invention provide tri-state nanotube logic circuits constructed from one or more nanotube-switching elements. The use of some embodiments of such devices offers a solution to the CMOS problems of power dissipation and radiation sensitivity. In certain embodiments, the present invention uses electromechanical switches including carbon nanotube channel elements to build complementary nanotube logic. Nanotube-based pull-up and pull-down circuits can be connected to form complementary circuits that only dissipate power when switching. In embodiments of the invention, the circuits are tri-state circuits that have a mode wherein the output can be set to a high-impedance condition. In certain embodiments, the circuits thus combine the benefits of nanotube switching elements with the tri-state feature. For complementary logic circuits, a pull-up tri-state element and a pull-down tri-state element are provided. In certain embodiments, the pull-up tri-state element is disposed between the upper power supply voltage and the pull-up tri-state logic circuitry. The pull-down element is disposed between the lower power supply voltage and the pull-down logical circuitry. Each tri-state element has a control structure for receiving a signal (or signals) that turns the element ON and OFF. The tri-state element is implemented using at least one nanotube-switching element. The provision of a high-impedance state for the output allows the outputs of multiple inverters to be connected together to form logic busses, logic decoders, or other logic circuits. There is no significant leakage current between input and output terminals in the "OFF" state of a complementary nanotube-based device, and there is no junction leakage. The nanotube devices may operate in harsh environments such as elevated temperatures, e.g., 150 to 200 deg-C. or higher. There is no alpha particle sensitivity. The interconnect wiring used to interconnect the nanotube device terminals may be conventional wiring such as AlCu, W, or Cu wiring with appropriate insulating layers such as $SiO_2$, polyimide, etc, or may be single or multi-wall nanotubes used for wiring.

Preferred embodiments of the invention provide device control inputs to switch the complementary logic outputs of an inverter from a low impedance logic zero and logic one state to a high impedance floating state. Outputs from multiple logic devices providing tri-state logic may be connected together, as long as only a single device is enabled to the low impedance state to drive the common output. The use of logic circuits providing a third, high impedance state to create bus structures and logic decoders is well known. The technology can be used in all present memory devices such as DRAM, SRAM, Flash, EEPROM, PROM, etc. Also, logic functions such as microprocessor, adders, random logic, PLAs, FPGAs, etc. can be fabricated with this invention.

Figure 2C:
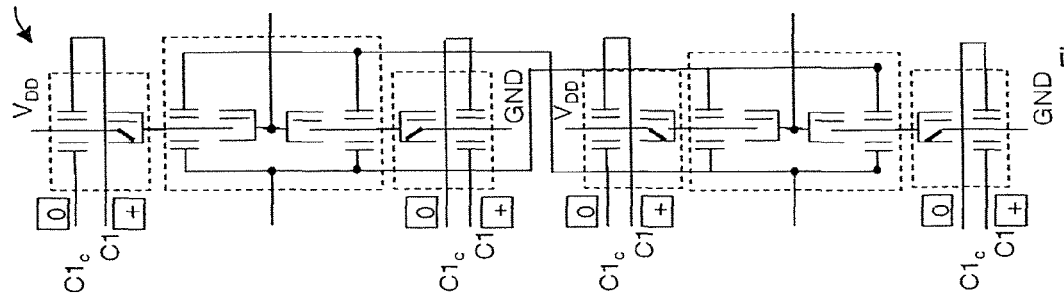

Aspects of the invention are demonstrated herein by reference to a device that implements an inverting logic function. FIG. 1A illustrates an exemplary differential (dual-rail input and dual-rail output) logic inverter 10, in which aspects of the invention may be used. The inverter 10 is constructed from four non-volatile nanotube switches 24, 26, 34, and 36, arranged in two inverters, a first inverter 20 and a second inverter 30. FIGS. 1B and 1C illustrate operation of inverter 10. (The schematic notation is discussed below with respect to FIGS. 4A-C.) FIG. 2A illustrates an exemplary tri-statable differential (dual-rail input and dual-rail output) logic inverter 50. Tri-statable differential logic inverter 50 also includes inverters 20 and 30, and each inverter 20 and 30 is connected to a pull-up tri-stating element provided by a nanotube switch 52, 62 and a pull-down tri-stating element provided by a nanotube switch 56, 66.

The operation of inverters 10 and 50 is better understood by reference to the operation of exemplary nanotube switching elements. FIGS. 3A-D depict an exemplary nanotube switching element 300 in cross-section and layout views and in two informational states for use in certain embodiments of the invention. A more detailed description of these switches and other architectures for nanotube switching elements may be found in the related cases identified and incorporated above. Non-volatile four-terminal nanotube switching elements are described in U.S. patent application Ser. No. 10/918,085, which is incorporated by reference above. A summary description follows here for convenience.

FIG. 3A is a cross sectional view of a preferred nanotube switching element 100. Nanotube switching element includes a lower portion having an insulating layer 117, control electrode 111, and output electrodes 113c,d. Nanotube switching element further includes an upper portion having release electrode 112, output electrodes 113a,b, and signal electrodes 114a,b. A nanotube channel element 115 is positioned between and held by the upper and lower portions.

Release electrode 112 is made of conductive material and is separated from nanotube channel element 115 by an insulating material 119. The channel element 115 is separated from the facing surface of insulator 119 by a gap height G102.

Output electrodes 113a,b are made of conductive material and are separated from nanotube channel element 115 by insulating material 119.

Output electrodes 113c,d are likewise made of conductive material and are separated from nanotube channel element 115 by a gap height G103. Notice that the output electrodes 113c,d are not covered by insulator.

Control electrode 111 is made of conductive material and is separated from nanotube channel element 115 by an insulating layer (or film) 118. The channel element 115 is separated from the facing surface of insulator 118 by a gap height G104.

Signal electrodes 114a,b each contact the nanotube channel element 115 and can therefore supply whatever signal is on the signal electrode to the channel element 115. This signal may be a fixed reference signal (e.g., $V_{DD}$ or Ground) or varying (e.g., a Boolean discrete value signal that can change). Only one of the electrodes 114a,b need be connected, but both may be used to reduce effective resistance.

Nanotube channel element 115 is a lithographically-defined article made from a porous fabric of nanotubes (more below). It is electrically connected to signal electrodes 114a,b. The electrodes 114a,b and support 116 pinch or hold the channel element 115 at either end, and it is suspended in the middle in spaced relation to the output electrodes 113a-d and the control electrode 111 and release electrode 112. The spaced relationship is defined by the gap heights G102-G104 identified above. For certain embodiments, the length of the suspended portion of channel element 115 is about 300 to 350 nm.

Under certain embodiments the gaps G103, G104, G102 are in the range of 5-30 nm. The dielectric on terminals 112, 111, and 113a and 113b are in the range of 5-30 nm, for example. The carbon nanotube fabric density is approximately 10 nanotubes per 0.2×0.2 um area, for example. The suspended length of the nanotube channel element is in the range of 300 to 350 nm, for example. The suspended length to gap ratio is about 5 to 15 to 1 for non-volatile devices, and less than 5 for volatile operation, for example.

FIG. 3B is a plan view or layout of nanotube switching element 100. As shown in this figure, electrodes 113b,d are electrically connected as depicted by the notation 'X' and item 102. Likewise electrodes 113a,c are connected as depicted by the 'X'. In preferred embodiments the electrodes are further connected by connection 120. All of the output electrodes collectively form an output node 113 of the switching element 100.

Figure 3C:
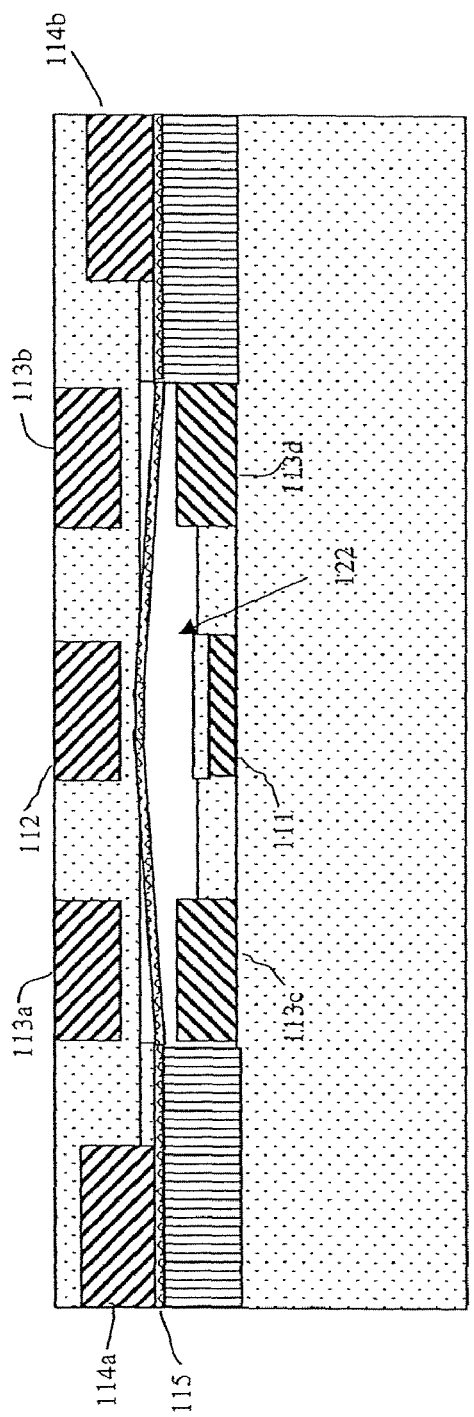
Figure 3D:
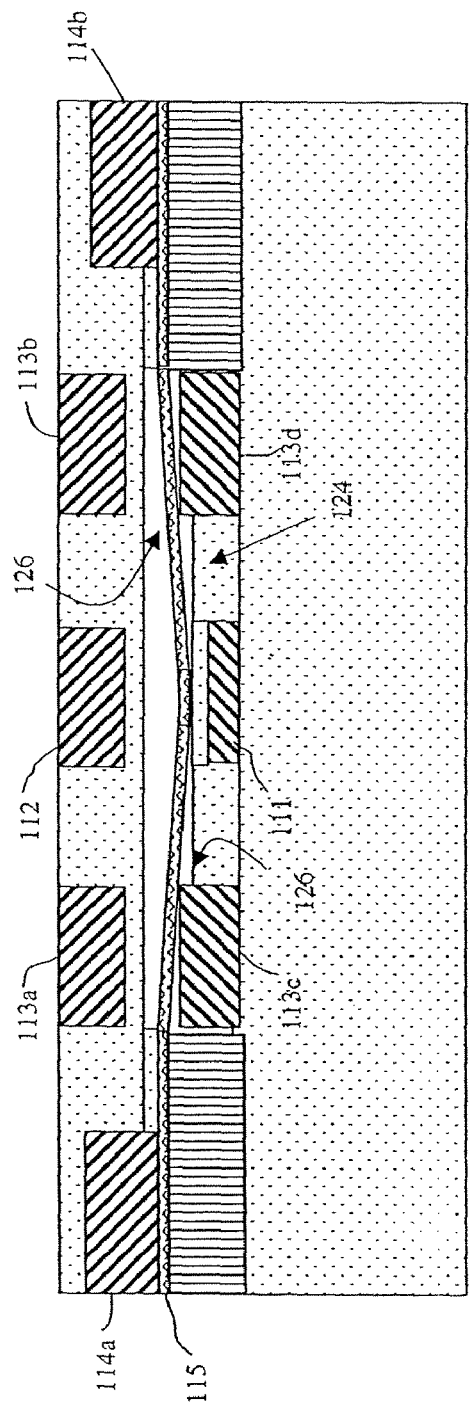

Under preferred embodiments, the nanotube switching element 100 of FIGS. 3A and 3B operates as shown in FIGS. 3C and D. Specifically, nanotube switching element 100 is in an OPEN (OFF) state when nanotube channel element is in position 122 of FIG. 3C. In such state, the channel element 115 is drawn into mechanical contact with dielectric layer 119 via electrostatic forces created by the potential difference between electrode 112 and channel element 115. Output electrodes 113a,b are in mechanical contact (but not electrical contact) with channel element 115. Nanotube switching element 100 is in a CLOSED (ON) state when channel element 115 is elongated to position 124 as illustrated in FIG. 3D. In such state, the channel element 115 is drawn into mechanical contact with dielectric layer 118 via electrostatic forces created by the potential difference between electrode 111 and channel element 115. Output electrodes 113c,d are in mechanical contact and electrical contact with channel element 115 at regions 126. Consequently, when channel element 115 is in position 124, signal electrodes 114a and 114b are electrically connected with output terminals 113c,d via channel element 115, and the signal on electrodes 114a,b may be transferred via the channel (including channel element 115) to the output electrodes 113c,d.

By properly tailoring the geometry of nanotube switching element 100, the nanotube switching element 100 may be made to behave as a non-volatile or a volatile switching element. By way of example, the device state of FIG. 3D may be made to be non-volatile by proper selection of the length of the channel element relative to the gap G104. (The length and gap are two parameters in the restoring force of the elongated, deflected channel element 115.) Length to gap ratios of greater than 5 and less than 15 are preferred for non-volatile device; length to gap ratios of less than 5 are preferred for volatile devices.

The nanotube switching element 100 operates in the following way. If signal electrode 114 and control electrode 111 (or 112) have a potential difference that is sufficiently large (via respective signals on the electrodes), the relationship of signals will create an electrostatic force that is sufficiently large to cause the suspended, nanotube channel element 115 to deflect into mechanical contact with electrode 111 (or 112). (This aspect of operation is described more fully in the incorporated patent references.) This deflection is depicted in FIGS. 3D (and 3C). The attractive force stretches and deflects the nanotube fabric of channel element 115 until it contacts the insulated region 118 of the electrode 111. The nanotube channel element is thereby strained, and there is a restoring tensile force, dependent on the geometrical relationship of the circuit, among other things.

By using appropriate geometries of components, the switching element 100 then attains the closed, conductive state of FIG. 3D in which the nanotube channel 115 mechanically contacts the control electrode 111 and also output electrode 113c,d. Since the control electrode 111 is covered with insulator 118 any signal on electrode 114 is transferred from the electrode 114 to the output electrode 113 via the nanotube channel element 115. The signal on electrode 114 may be a varying signal, a fixed signal, a reference signal, a power supply line, or ground line. The channel formation is controlled via the signal applied to the electrode 111 (or 112). Specifically the signal applied to control electrode 111 needs to be sufficiently different in relation to the signal on electrode 114 to create the electrostatic force to deflect the nanotube channel element to cause the channel element 115 to deflect and to form the channel between electrode 114 and output electrode 113, such that switching element 100 is in the CLOSED (ON) state.

In contrast, if the relationship of signals on the electrode 114 and control electrode 111 is insufficiently different, then the nanotube channel element 115 is not deflected and no conductive channel is formed to the output electrode 113.

Instead, the channel element 115 is attracted to and physically contacts the insulation layer on release electrode 112. This OPEN (OFF) state is shown in FIG. 3C. The nanotube channel element 115 has the signal from electrode 114 but this signal is not transferred to the output node 113. Instead, the state of the output node 113 depends on whatever circuitry it is connected to and the state of such circuitry. The state of output node 113 in this regard is independent of channel element voltage from signal electrode 114 and nanotube channel element 115 when the switching element 100 is in the OPEN (OFF) state.

If the voltage difference between the control electrode 111 (or 112) and the channel element 115 is removed, the channel element 115 returns to the non-elongated state (see FIG. 3A) if the switching element 100 is designed to operate in the volatile mode, and the electrical connection or path between the electrode 115 to the output node 113 is opened.

Preferably, if the switching element 100 is designed to operate in the non-volatile mode, the channel element is not operated in a manner to attain the state of FIG. 3A. Instead, the electrodes 111 and 112 are expected to be operated so that the channel element 115 will either be in the state of FIG. 3C or 3D.

The output node 113 is constructed to include an isolation structure in which the operation of the channel element 115 and thereby the formation of the channel is invariant to the state of the output node 113. Since in the preferred embodiment the channel element is electromechanically deflectable in response to electrostatically attractive forces, a floating output node 113 in principle could have any potential. Consequently, the potential on an output node may be sufficiently different in relation to the state of the channel element 115 that it would cause deflection of the channel element 115 and disturb the operation of the switching element 100 and its channel formation; that is, the channel formation would depend on the state of an unknown floating node. In the preferred embodiment this problem is addressed with an output node that includes an isolation structure to prevent such disturbances from being caused.

Specifically, the nanotube channel element 115 is disposed between two oppositely disposed electrodes 113b,d (and also 113 a,c) of equal potential. Consequently, there are opposing electrostatic forces that result from the voltage on the output node. Because of the opposing electrostatic forces, the state of output node 113 cannot cause the nanotube channel element 115 to deflect regardless of the voltages on output node 113 and nanotube channel element 115. Thus, the operation and formation of the channel is made invariant to the state of the output node.

Figure 4C:
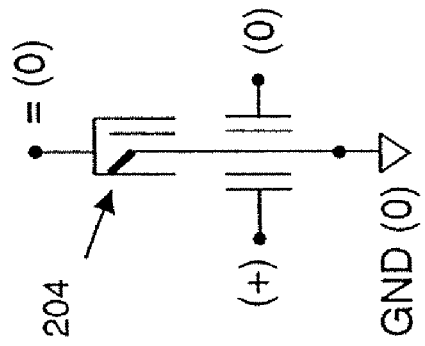
FIGS. 4A-C are schematic representations of a nanotube switching element in various states of operation according to an embodiment of the invention.
Figure 4B:
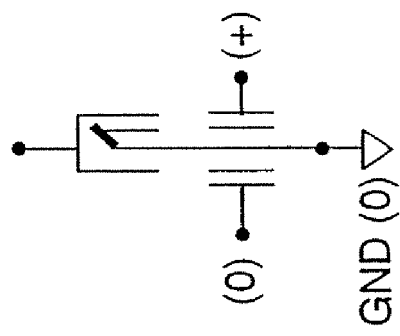
Figure 4A:
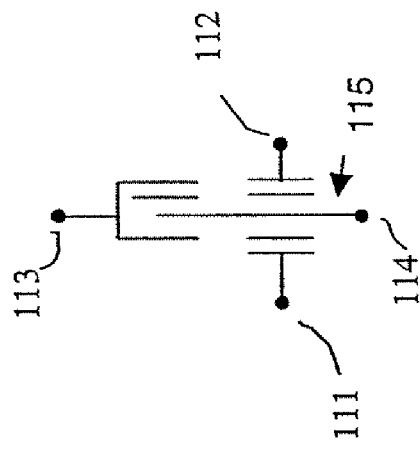

Under certain embodiments of the invention, the nanotube switching element 100 of FIG. 3A may be used as a pull-up or pull-down device to form power-efficient circuits. Unlike MOS and other forms of circuits, in complementary circuits, the nanotube based pull-up and pull-down devices may be identical devices and need not have different sizes or materials. To facilitate the description of such circuits and to avoid the complexity of the layout and physical diagrams of FIGS. 3A-D, a schematic representation shown in FIGS. 4A-C has been developed to depict the switching elements. The nodes identified by the same reference numerals in FIGS. 4A-C correspond to the structures shown in FIGS. 3A-D. The thick black line 204 represents the nanotube channel element and more particularly its contact state. In FIG. 4B, the nanotube channel element is insulated from the output terminal and the device is OFF. In FIG. 4C, the nanotube channel element is in electrical contact with the output terminal and the device is ON.

In summary, a four-terminal nanotube switching element includes a nanotube channel element that provides a controllably formable conductive channel from an input terminal to an output terminal. The input terminal is permanently in electrical contact with the channel element. The input terminal is connected to an input signal that is preferably fixed or has a known potential. A control input provided via a control terminal controls the formation of the conductive channel. A release input, which is complementary to the control input in preferred embodiments, provided via a release terminal resets the nanotube channel element from an ON state to an OFF state.

Referring again to FIGS. 1A and 2A, inverter 20 has a first logical input A applied to input terminal 22, a second logical input $A_C$ applied via terminal 32, and a logical output Aout provided on output terminal 28. The control electrodes of switching elements 34 and 36 are tied together to input terminal 22. The release electrodes of switching elements 24 and 26 are tied together to input terminal 32. In preferred embodiments, $A_C$ is the logical complement of signal A. The control and release electrodes are thus operated in a complementary fashion, ensuring that each nanotube switching element is in a known state during operation of the device 10. The signal electrode of nonvolatile device 24 is connected to voltage $V_{DD}$ (the upper power supply voltage) and the signal electrode of nonvolatile device 26 is connected to ground (the lower power supply voltage). In operation, a nanotube switching element, having the architecture used in preferred embodiments of the invention for switching elements 24, 26, 34 and 36, inherently implements an inverting function. The switching element is activated by a potential difference between the signal electrode and the control and/or release electrode. Switching elements 24 and 26 are arranged to invert signal A. Only one of switches 24 and 26 will be conducting for a given value of differential signal $A/A_C$, and output 28 will be connected to either $V_{DD}$ (when A is logically zero) or GND (when A is logically one).

Inverter 30 has a first logical input $A_C$ applied to input terminal 32, a second logical input A applied via terminal 22, and a logical output $Aout_C$ provided on output terminal 38. The control electrodes of switching elements 34 and 36 are tied together to input terminal 32. The release electrodes of switching elements 34 and 36 are also tied together to input terminal 22. The signal electrode of switching element 34 is connected to voltage $V_{DD}$, and the signal electrode of switching element 36 is connected to ground. Together, switching elements 34 and 36 operate like switching elements 24 and 26 to invert the input, but switching elements 34 and 36 are connected to logical input $A_C$. Switching elements 34 and 36 are arranged to invert signal $A_C$. Combined first and second inverters 20 and 30, and associated interconnections and supply voltages, comprise differential inverter 10.

FIG. 1B illustrates inverter state of inverter 10 when input A is positive ($V_{DD}$) and input $A_C$ is ground. In switching element 24, the nanotube element is attracted to the insulated release electrode and does not conduct. In switching element 26, the nanotube element is attracted by the control electrode to contact the output electrode, forming a conductive path from GND to output terminal 28. In switching element 34, the nanotube switching element is likewise attracted by the control electrode to contact the output electrode, forming a conductive path from $V_{DD}$ to output terminal 38. In switching element 36, the nanotube element is attracted to the insulated release electrode and does not conduct. In summary, inverter output 28 is at 0 volts, connected to ground by switch 26, and inverter output 38 is positive, connected to $V_{DD}$ by switch 34.

FIG. 1C illustrates inverter 10 in a second state when input A is zero and input $A_C$ is positive ($V_{DD}$). In switching element 24, the nanotube element is attracted by the control electrode to contact the output electrode, forming a conductive path from $V_{DD}$ to output terminal 28. In switching element 26, the nanotube element is attracted to the insulated release electrode and does not conduct. In switching element 34, the nanotube element is attracted to the insulated release electrode and does not conduct. In switching element 36, the nanotube switching element is likewise attracted by the control electrode to contact the output electrode, forming a conductive path from GND to output terminal 38. In summary, inverter output 28 is at 0 volts, connected to ground by switch 26, and inverter output 38 is positive, connected to $V_{DD}$ by switch 34. In operation, output Aout of inverter 10 is the logical inversion of input A and output $Aout_C$ of inverter 10 is the logical inversion of input $A_C$ (or, in other words, is equivalent to signal A).

FIG. 2A illustrates a preferred embodiment of a differential logic tri-state inverter circuit 50 formed of inverters 20 and 30 illustrated in FIG. 1A, and non-volatile nanotube switching elements 52, 56, 62 and 66 and associated interconnections. Switching elements 52, 56, 62 and 66 are controlled by a signal C1 and its complement $C1_C$. Switching elements 52, 56, 62 and 66 are activated only when C1 is high. Otherwise, switching elements 52, 56, 62 and 66 are in the OFF state, and in this condition, inverter 50 is tri-stated and the output is effectively disconnected, regardless of the values of input signal A and $A_C$.

Switching element 52 is electrically disposed between the power supply voltage and the pull-up circuit of inverter 20. Switching element 52 is controlled by a tri-state control input 53 and tri-state release input 54. Tri-state control input 53 and tri-state release input 54 are connected to complementary tri-state control signals $C1_C$ and C1, respectively. Because switching element 52 is connected to $V_{DD}$, switching element 52 is activated when the signal on input 53 is low, and it must be controlled by $C1_C$, a signal with inverse polarity to C1, to obtain the desired operation. Switching element 56 is electrically disposed between the GND connection and the pull-down circuit of inverter 20.

Figure 2B:
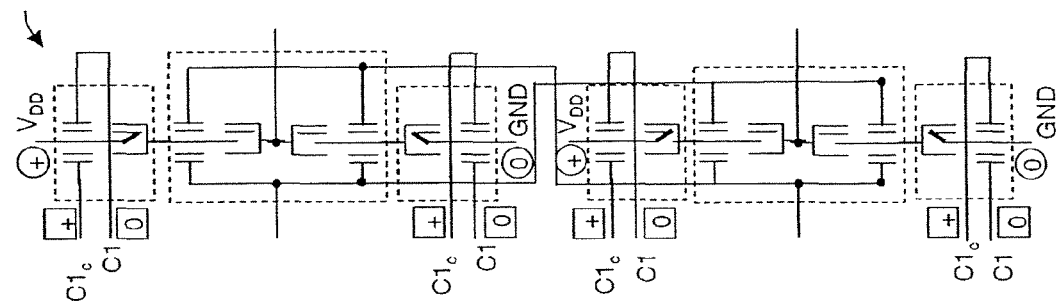
Figure 2A:
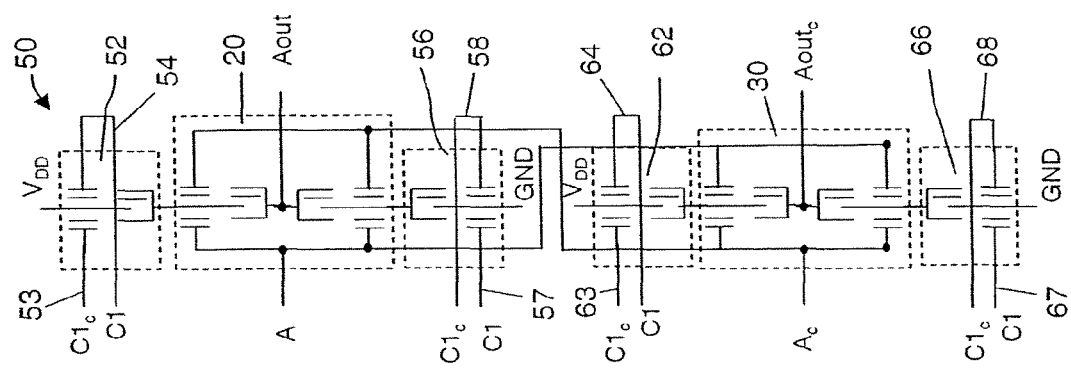

FIG. 2B illustrates tri-state inverter 50 in a first physical and electrical state nanotube switching elements 52, 56, 62 and 66 are in the "OFF" state, with the nanotube elements in contact with insulated opposing output electrodes. The signal electrodes of nanotube switching elements 24 and 26 and 34 and 36 are not connected to power supply lines. Accordingly, $V_{DD}$ and ground voltages are not applied to the inverter devices and no inverter operation takes place. Output voltages of signals Aout and $Aout_C$ are not defined.

The tri-stating function operates like an enable/disable feature. The tri-stated output allows the circuit 50 to share the same signal path as other circuits. Tri-state inverter 50 has a number of applications, such as sharing a common bus (not shown) with other circuits. When tri-state inverter 50 is tri-stated, or in the "OFF" state, bus operation is controlled by other circuits (not shown).

FIG. 2C illustrates tri-state inverter 50 in a second physical and electrical state nanotube switching elements 52, 56, 64, and 66 are in the "ON" state, with the nanotube elements in contact with corresponding output electrodes. Power supply voltage $V_{DD}$ is applied to nanotube switching elements 24 and 34, and ground is applied to nanotube switching elements 26 and 36. With tri-state inverter in the "ON" state, inverter operation as described with respect to FIG. 1 resumes. In the "ON" state, tri-state inverter 100 controls (drives) a shared bus (not shown) or other circuits interconnected to the differential outputs 28 and 38.

The nanotube switching elements of preferred embodiments are non-volatile. Inverter 50 thus can retain both its logical state and its enable state if power to the circuit is removed or interrupted. The original state is present when power to the circuit is resumed. This property has a number of applications and advantages, including power failure protection and memory functions.

The following are assigned to the assignee of this application, and are hereby incorporated by reference in their entirety:

U.S. patent application Ser. No. 10/341,005, filed on Jan. 13, 2003, entitled *Methods of Making Carbon Nanotube Films, Layers, Fabrics, Ribbons, Elements and Articles*;

U.S. patent application Ser. No. 09/915,093, now U.S. Pat. No. 6,919,592, filed on Jul. 25, 2001, entitled *Electromechanical Memory Array Using Nanotube Ribbons and Method for Making Same*;

U.S. patent application Ser. No. 10/033,032, now U.S. Pat. No. 6,784,028, filed on Dec. 28, 2001, entitled *Methods of Making Electromechanical Three-Trace Junction Devices*;

U.S. patent application Ser. No. 10/033,323, now U.S. Pat. No. 6,911,682, filed on Dec. 28, 2001, entitled *Electromechanical Three-Trace Junction Devices*;

U.S. patent application Ser. No. 10/128,117, now U.S. Pat. No. 6,835,591, filed on Apr. 23, 2002, entitled *Methods of NT Films and Articles*;

U.S. patent application Ser. No. 10/341,055, filed Jan. 13, 2003, entitled *Methods of Using Thin Metal Layers to Make Carbon Nanotube Films, Layers, Fabrics, Ribbons, Elements and Articles*;

U.S. patent application Ser. No. 10/341,054, filed Jan. 13, 2003, entitled *Methods of Using Pre-formed Nanotubes to Make Carbon Nanotube Films, Layers, Fabrics, Ribbons, Elements and Articles*;

U.S. patent application Ser. No. 10/341,130, filed Jan. 13, 2003, entitled *Carbon Nanotube Films, Layers, Fabrics, Ribbons, Elements and Articles*;

U.S. patent application Ser. No. 10/776,059, now U.S. Pat. No. 7,259,410, filed Feb. 11, 2004, entitled *Devices Having Horizontally-Disposed Nanofabric Articles and Methods of Making The Same*;

U.S. patent application Ser. No. 10/776,572, now U.S. Pat. No. 6,924,538, filed Feb. 11, 2004, entitled *Devices Having Vertically-Disposed Nanofabric Articles and Methods of Making the Same*;

Preferred embodiments of the invention are compatible with CMOS circuits and can be manufactured in an integrated way with CMOS circuits. It is contemplated that certain embodiments of the invention can be used interchangeably with existing field effect device implementations, e.g., CMOS implementations. CMOS designs can readily be converted to nanotube switch designs. Storage devices constructed according to the invention can be substituted for CMOS cells in larger CMOS circuits without impacting other portions of the original design. New designs combining nanotube switch technology with CMOS technology can readily be created by using embodiments of present invention with components selected from a CMOS device library.

In view of the wide variety of embodiments to which the principles of the present invention can be applied, it should be understood that the illustrated embodiments are exemplary only, and should not be taken as limiting the scope of the present invention. Preferred embodiments use the nanotube-based switches of the incorporated related references. As described therein, many volatile and non-volatile configurations may be used. Combinations of different configurations may also be used. These switches may then be arranged and sized based on the requirements of a particular application, limitations of certain fabrication techniques, etc. While single walled carbon nanotube channel elements are preferred, multi-walled carbon nanotubes may also be used. Also, nanotubes may be used in conjunction with nanowires. Nanowires as referenced herein includes single nanowires, aggregates of non-woven nanowires, nanoclusters, nanowires entangled with nanotubes comprising a nanofabric, mattes of nanowires, etc. While carbon nanotube channel elements are preferred, it is contemplated that other nanotube channel elements may also be used in some embodiments.

Other aspects, modifications, and embodiments are within the scope of the following claims. The invention may be embodied in other specific forms without departing from the spirit or essential characteristics thereof. The present embodiments are therefore to be considered in respects as illustrative and not restrictive, the scope of the invention being indicated by the appended claims rather than by the foregoing description, and all changes which come within the meaning and range of the equivalency of the claims are therefore intended to be embraced therein.

What is claimed is:

1. A transfer device, comprising:
   an input node;
   a control structure comprising a set electrode and a release electrode;
   an output node; and
   a nanotube element including at least one electrically conductive nanotube in contact with the input electrode,
   wherein the nanotube element is constructed and arranged to transfer an electrical signal between the input node and the output node in response to a first electrical signal at the control structure,
   wherein the nanotube element is constructed and arranged to transfer no electrical signal between the input node and the output node in response to a second electrical signal at the control structure, and
   wherein the nanotube element is between the set electrode and the release electrode.

2. The transfer device of claim 1, wherein the nanotube element non-volatilely transfers the electrical signal between the input node and the output node after application of the first electrical signal.

3. The transfer device of claim 1, further comprising circuitry configured to apply a signal applied to the set electrode that is a complement of a signal applied to the release electrode.

4. The transfer device of claim 1, further comprising an insulator layer disposed on a surface of the set electrode facing the nanotube element, and further comprising an insulator layer disposed on a surface of the release electrode facing the nanotube element.

5. The transfer device of claim 1, wherein the output node comprises first and second electrodes, wherein the nanotube element is between the first and second electrodes.

6. The transfer device of claim 5, further comprising an insulator layer disposed on a surface of one of the first and second electrodes facing the nanotube element.

7. The transfer device of claim 1, wherein the input node is connected to one of $V_{DD}$ and ground.

8. The transfer device of claim 7, wherein the control structure is connected to circuitry that generates the first electrical signal, and wherein the first electrical signal is at the one of $V_{DD}$ and ground.

* * * * *